United States Patent
Hertel et al.

(10) Patent No.: US 7,339,776 B1
(45) Date of Patent: Mar. 4, 2008

(54) SILICON CARBIDE DIODE VOLTAGE LIMITER

(75) Inventors: Thomas A. Hertel, Santa Clarita, CA (US); Daniel Tan, Walnut, CA (US)

(73) Assignee: Pratt & Whitney Rocketdyne, Inc., Canoga Park, CA (US)

( * ) Notice: Subject to any disclaimer, the term of this patent is extended or adjusted under 35 U.S.C. 154(b) by 0 days.

(21) Appl. No.: 11/637,494

(22) Filed: Dec. 12, 2006

(51) Int. Cl.
*H02H 3/22* (2006.01)
*H01L 31/0312* (2006.01)

(52) U.S. Cl. ........................................ 361/111; 257/77
(58) Field of Classification Search ................ 361/111; 257/77
See application file for complete search history.

(56) References Cited

U.S. PATENT DOCUMENTS

| | | | |
|---|---|---|---|
| 6,952,355 B2 | 10/2005 | Riggio et al. | |
| 7,042,086 B2 * | 5/2006 | Shimoida et al. | 257/724 |
| 2007/0200115 A1 * | 8/2007 | Das et al. | 257/77 |

* cited by examiner

*Primary Examiner*—Evan Pert
(74) *Attorney, Agent, or Firm*—Kinney & Lange, P.A.

(57) ABSTRACT

A voltage excursion control system for limiting transient voltage peaks in electrical circuits otherwise occurring across selected components therein in response to changing conditions in such circuits has a plurality of silicon carbide diode dice series-interconnected in a succession such that each cathode region of each die face toward a common end of the succession. First and second electrically conductive electrodes are each electrically interconnected with a corresponding one of the dice at opposite ends of the succession.

8 Claims, 4 Drawing Sheets

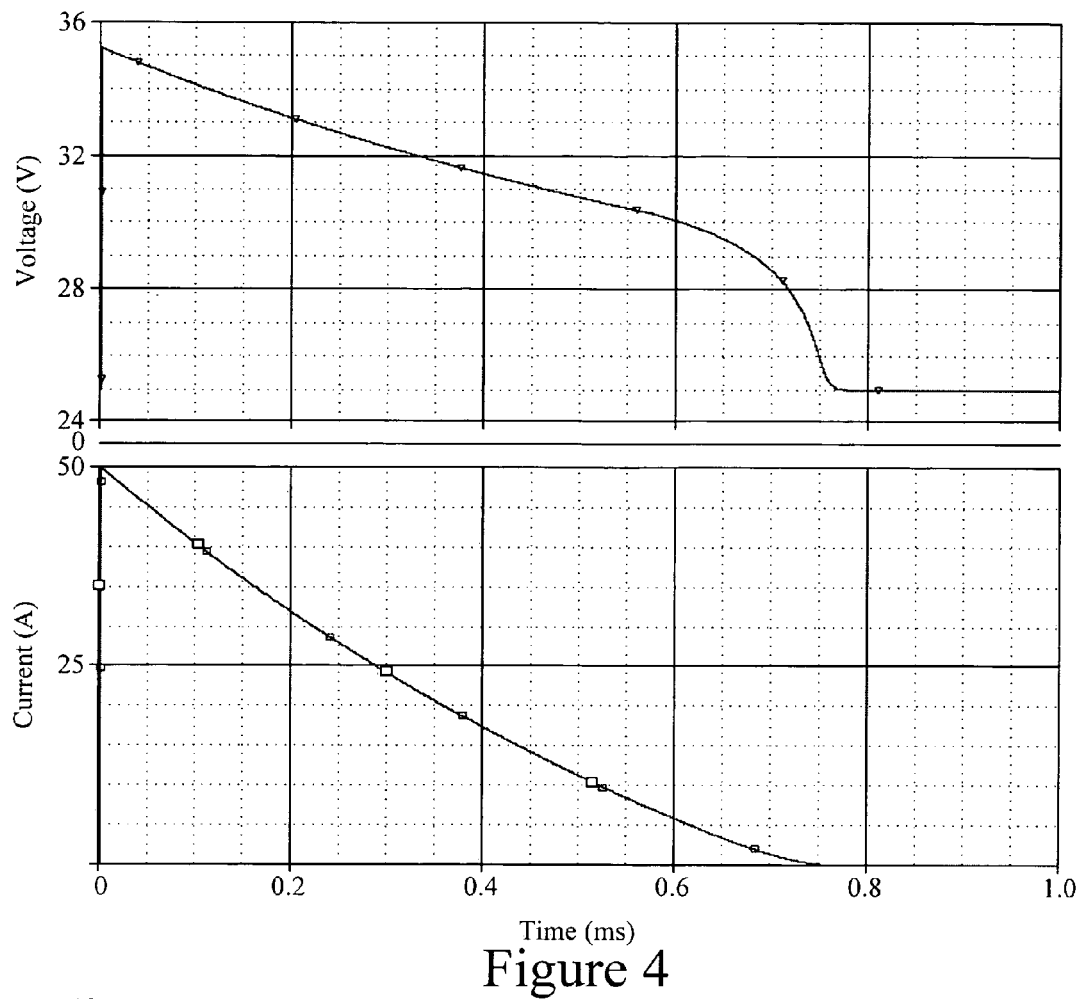
Figure 4
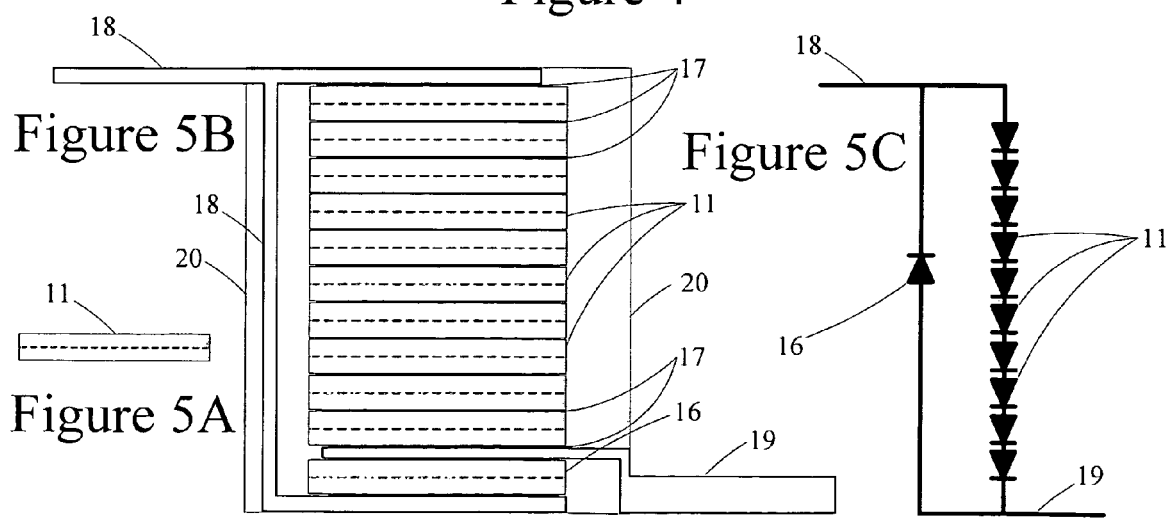

US 7,339,776 B1

SILICON CARBIDE DIODE VOLTAGE LIMITER

BACKGROUND OF THE INVENTION

The present invention relates to limiting voltage excursions in electrical circuits including suppressing transient voltage peaks, and, more particularly, to suppressing them quickly.

A "snubber" arrangement is used in electrical circuits where there is the possibility of large voltage peaks, or voltage "spikes", occurring in those circuits, often immediately following a switch being opened in the circuit because of inductance in that circuit causing a transient voltage peak, i.e. an inductive "kick". Such voltage spikes are deleterious to the switch because the large voltage causes an electrical discharge across the gap between the separating switch contacts as the switch is being opened leading to damaging those contacts and so limiting the time to failure of that switch.

As an example, FIG. 1A shows a schematic diagram of a representative circuit, 1, in which power flows occur subject to being switched on and off. Circuit 1 contains an inductor, 2, taken to have an inductance of 100 μH representing circuit parasitic inductance, and a resistor, 3, taken to have a value of 0.03 Ω representing a circuit electrical load in this large electrical power circuit. Further, there is provided a power flow control switch, 4, having an electrical resistance when the contacts thereof are closed of 0.2 Ω. All of the foregoing components are connected in series with one another and across a direct current voltage source, 5, providing 25 V of electrical potential between its two terminals.

An available simulation of the performance of this circuit upon an opening of switch 4 following a closing thereof at least long enough for the associated transients to subside does not simulate an actual electrical discharge occurring across the gap developing between the separating ideal switch contacts in opening of the switch to show the full effect of the circuit parasitics. However, the graph in FIG. 1B has an upper plot of the simulated voltage response with the simulation data points marked with squares to the opening of switch 4, and a lower plot of the corresponding current response with simulation data points being marked with triangles, both absent any effects due to the accompanying the discharge across the contacts separation gap. The upper plot shows, nevertheless, a voltage response greater than 35 kV at its peak. This is a peak value that is large enough to cause an arc discharge across the gap developed between the opening switch contacts such as occurs in the opening of the contacts of a typical relay. Though the lower plot shows the circuit current decreases to zero following this switching event, there is still substantial current in the circuit at the time of occurrence of the voltage spike to thereby result in a corresponding electrical power spike. Without a snubber arrangement of some kind across switch 4, this transient voltage peak and the associated arc discharge will damage, and so reduce the operational duration of, the switch contacts.

In the past, a complex of inductors and capacitors were often used in a filter configuration in providing such snubber arrangements. These configurations tended to be relatively large. Alternate arrangements used in these applications are Zener diodes and transient voltage suppressors, or transorbs, and Zener diodes have also been used as circuit "clamps" to similarly limit circuit operating voltage excursions to some maximum or minimum value. While these devices are much smaller than the filter arrangement, the response and power rating of these devices make their suitability in substantial power handling circuits limited. Thus, there is a desire for a snubber arrangement suited to circuits carrying large power flows but which provide snubbers of relatively small size and rapid reaction.

BRIEF SUMMARY OF THE INVENTION

The present invention provides a voltage excursion control system for limiting transient voltage peaks in electrical circuits otherwise occurring across selected components therein in response to changing conditions in such circuits with the system having a plurality of silicon carbide diode dice each having an anode and a cathode region therein and each positioned in a spatial succession thereof. Each such die is interconnected by an electrically conductive metal bond with each neighbor thereof in the succession such that each cathode region of each die face toward a common end of the succession. First and second electrically conductive electrodes are each electrically interconnected by an electrically conductive metal bond with a corresponding one of the dice at opposite ends of the succession. The electrode interconnected to an anode region of a die is so interconnected by one of a pair of extensions provided in that electrode with a gap between them in which the succession and the remaining electrode are positioned. An antiparallel diode die has a cathode region therein electrically interconnected by an electrically conductive metal bond with that remaining one of the pair of extensions and has an anode region therein electrically interconnected by an electrically conductive metal bond with the remaining one of the first and second electrodes

BRIEF DESCRIPTION OF THE DRAWINGS

FIG. 4 shows a graph with plots of an electrical response to a switch activation in the circuit of FIG. 3, FIGS. 5A, 5B and 5C show layer diagrams and an equivalent circuit for the present invention.

DETAILED DESCRIPTION

A basis for a more suitable voltage excursion control circuit is provided by using a high voltage silicon carbide (SiC) p-i-n diode, a p-n junction diode having an intrinsic, or lightly doped region, positioned between the p and n regions in the diode. Such a diode for a snubber arrangement must configured to be capable of carrying large electrical currents therethrough to accommodate the large current transients that will ensue in limiting voltage peaks during the control switchings that occur in controlling power flows in large electrical power flow circuits. In addition, these large electrical currents through that diode are desired to be associated with substantial forward voltage drops across the diodes to allow relatively few such diodes being connected in series to set the snubber breakover voltage suited for the voltage levels encountered during steady state operations of the power circuit having its switch being protected by the provision of the snubber arrangement. As a result, these diodes must also be capable of withstanding large electrical power peaks occurring therein and dissipating the heat resulting from such power peaks to the surrounding environment. Such needs in a diode also can occur in some clamping circuit arrangements where, rather than controlling the magnitudes of transient voltage peaks, excursions of the magnitude of the operating voltages that are encountered during use of the circuit are limited with respect to some voltage value in the circuit such as power supply voltages or some other reference voltage such as ground.

Figure 2:
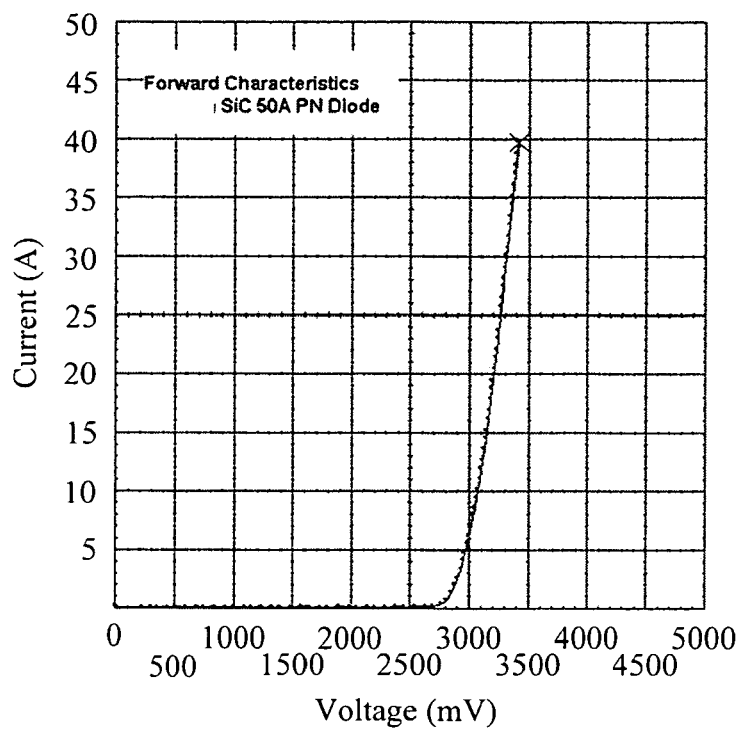
FIG. 2 shows a graph with a plot of the current versus voltage characteristic of an electrical component.

SiC p-i-n diodes can be fabricated with characteristics which are well suited to meeting these requirements. FIG. 2 is a graph with the current versus voltage characteristic of a 10 mils thick silicon carbide p-i-n diode die commercially available from Cree, Inc. capable of carrying various values of forward electrical current of up to as much as 50 A with a forward voltage, or $V_f$, between 2.8 V and 3.6 V depending on the magnitude of the current conducted therethrough. Below 2.8 V the diode shown in FIG. 2 conducts a small fraction of its 50 A rated current, i.e. at 2.5 V the diode conducts 182.9 µA. Above the 2.8 V the diode conducts electrical currents therethrough of up to its rated current of as much as 50 A.

This diode die, in being rated for 50 A, will be able to conduct transient electrical currents therethrough of 50 A. The transients associated with a switching in circuits for conducting large electrical power flows have very fast rise times and very short durations. Such switchings occur relatively infrequently so that there are relatively few of them each having a short duration to result in limited operating temperature increases. Thus, the diode may, in many use situations, be capable to handling even larger magnitude current transients since SiC is an excellent conductor of heat and has a positive thermal resistive coefficient.

Figure 1A:
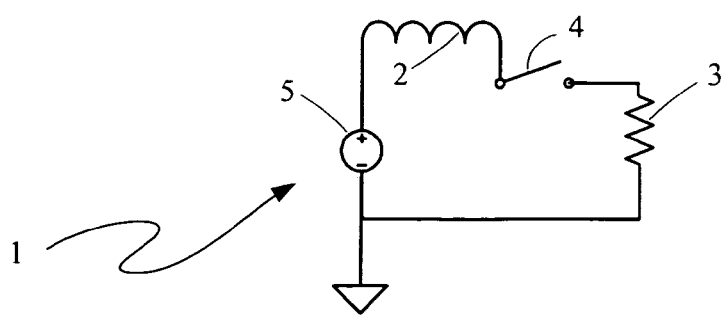
FIGS. 1A and 1B shows a schematic diagram of a switch activation transient test circuit and a graph with plots of an electrical response.
Figure 3:
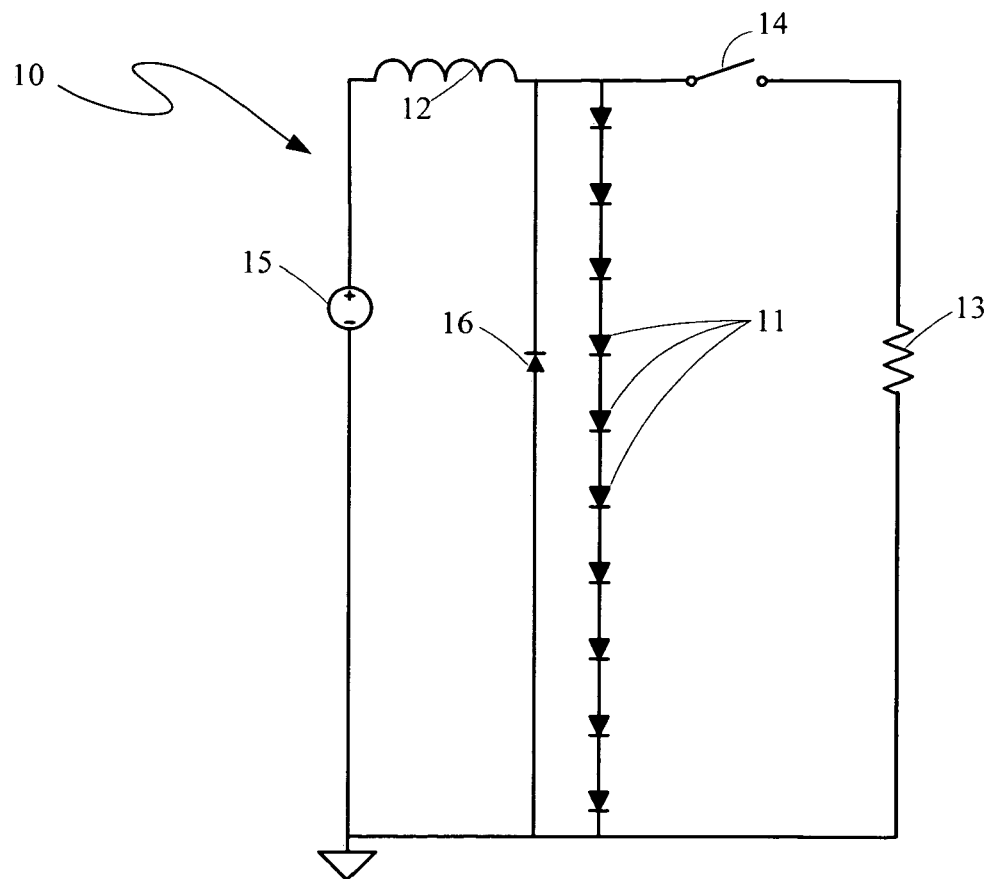
FIG. 3 shows a schematic diagram of the circuit in FIG. 1A with a modification embodying the present invention.

Thus a schematic diagram of the circuit, 10, is shown in FIG. 3 much like circuit 1 of FIG. 1A but here with a snubber arrangement inserted therein provided by ten series-connected SiC p-i-n diodes, 11, each having substantially the current versus voltage characteristic shown in FIG. 2. Circuit 10 again has a parasitic inductance, 12, also with a value of 100 µH, and a load resistor, 13, also with a value of 0.3 Ω, connected together in series with one another and with a power flow control switch, 14, having a closed contacts resistance of 0.2 Ω. These series-connected components are all connected across a direct current voltage source, 15, of 25 V potential as in the circuit of FIG. 1.

The ten series connected diodes 11 forming the snubber are connected as a series string between the junction of parasitic inductance 12 and power control switch 14 on the anode end thereof, or the end connected to a diode p-type conductivity region, with the remaining cathode end of the string, or the end connected to a diode n-type conductivity region, being connected to ground. A further single diode, 16 positioned between the same two circuit points as is the string but is in antiparallel with the other diodes in having its anode connected to ground and its cathode connected to the junction of inductance 12 and switch 14 to clip off the low value portions of any "ringing" waveforms generated by a switching of switch 4.

The forward voltage $V_f$ of each of the diodes add together to provide the snubber breakdown voltage above which the series-connected string of diodes 11 begin to pass significant electrical current to ground. Thus, with each diode 11 having a forward voltage drop $V_f$ of at least 2.8 V to carry a significant electrical current, the string provides a minimum snubber breakover voltage of 10 $V_f$=28 V which must be exceeded for the string to carry a significant electrical current, a value in excess of the potential supplied by DC voltage source 15. Hence, the circuit of FIG. 3 does not have a voltage therein during steady state operation of sufficient magnitude to cause the string to carry a significant current, and so the circuit operates in those circumstances just as the circuit of FIG. 1 operates.

However, upon an opening of switch 14 following a closing thereof lasting long enough for the closing transient to disappear, the magnetic field collapsing about inductance 12 will attempt to generate a large voltage peak across the opening contacts of switch 4 and load resistor 3. Once the voltage rises to a value exceeding the breakover voltage of the string of diodes 11, they will be capable of conducting large currents to thereby keep the voltage rise thereacross close to that breakover voltage and so limit the voltage resulting between the opening contacts of switch 4 to prevent arc discharges between them. A simulation of the voltage drop across contacts of switch 4 in circuit 10 upon opening that switch is shown in the graph of FIG. 4 with the upper plot again being the voltage response, this plot now having triangles therein for simulation data points, which plot shows the peak voltage being limited to just 35 V to thereby prevent any arc discharges. The lower plot is again the current response with data points therein being presented as squares showing the current in the circuit, following the opening of switch 4, as it diminishes to zero.

Figure 1B:
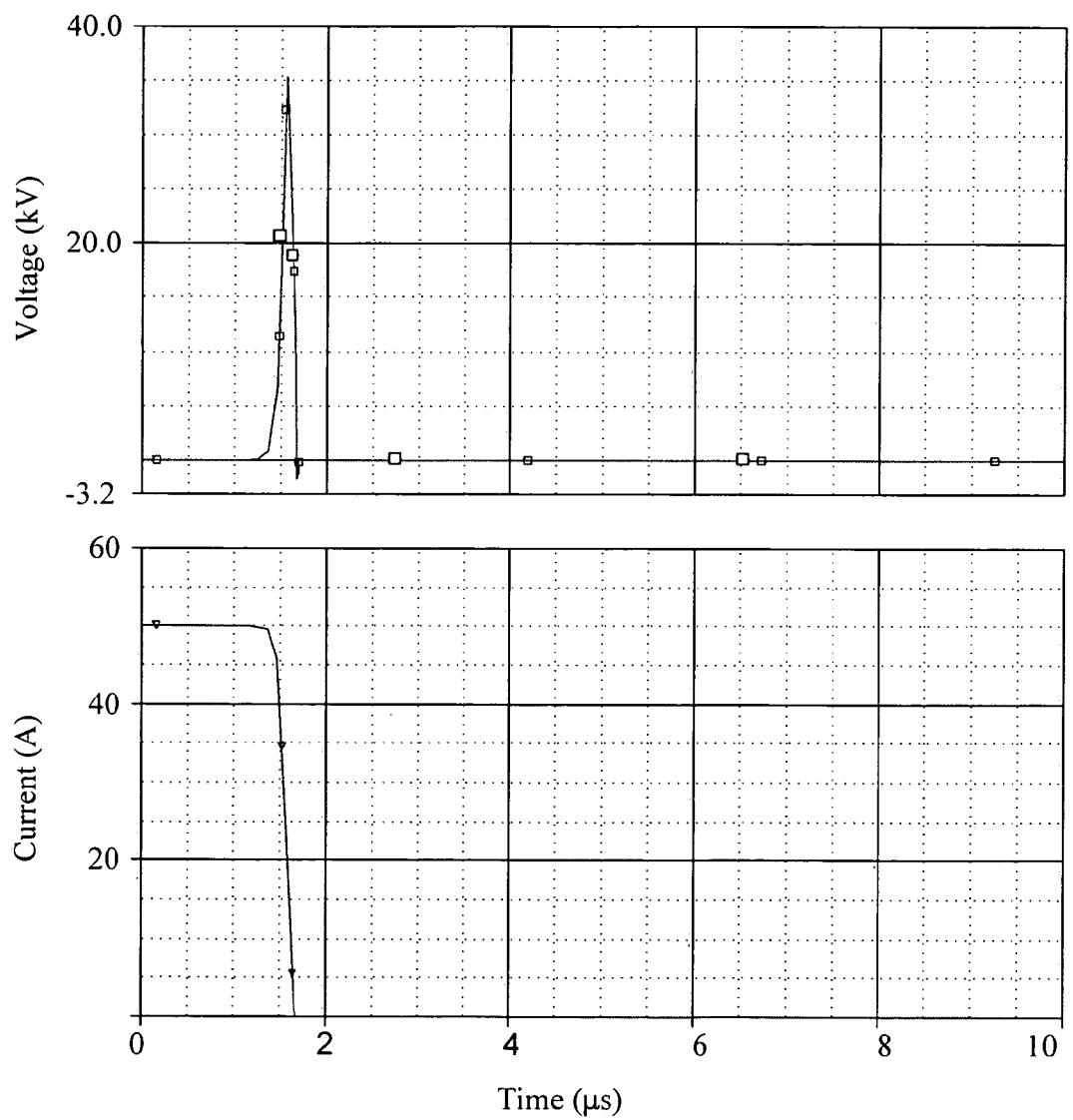

The relatively large value for $V_f$ in SiC p-i-n diodes requires that only ten such diodes be connected in series to exceed the 25 V potential of source in circuit 10 of FIG. 3 so that the circuit will operate just like circuit 1 of FIG. 1 during steady state operation. If, alternatively, silicon p-n junction diodes were used for the snubber arrangement with there forward voltage $V_f$ of only 0.7 V, such a string of diodes would require 40 die connected in series, a very much more costly to assemble series-connected die arrangement than one with but ten die therein. Silicon carbide material also has a 13:1 power dissipation advantage over silicon material so that the die can be much smaller. In addition, SiC is a much more robust material so that packaging techniques can be used involving larger temperatures to thereby provide much better die attachments to the corresponding device housings resulting in SiC diodes providing greater reliability than can use of silicon semiconductor material.

As an alternative use, if, for example, six of the diodes in the string of ten diodes were replaced by a short circuiting electrical conductor and inductor 12 were replaced by a resistor of a resistance value substantially matching that of resistor 3, the remaining four effective diodes in the string would form a "clamping" circuit with respect to ground. The voltage dropped across resistor 3 would be limited to around 11.2 Volts during operation of the circuit with switch 14 closed, and the remaining voltage supplied by power supply 15 would be dropped across the resistor substituted for inductor 12 all of which would also occur even if power supply 15 varied in output voltage magnitude with time so long as the voltage magnitudes continued to be positive. Such strings of diodes can also be used in circuits where operating voltage magnitudes are negative, or negative part of the time, and can provide clamping of circuit operating voltages with respect to voltage references other than ground with suitable circuit modifications.

The voltage excursion limiting circuit as the snubber arrangement schematically shown by the string of series-connected diodes 11 in FIG. 3 is implemented as shown in FIG. 5. FIG. 5A shows a side view of an individual SiC p-i-n diode die 11 having its anode p-type conductivity region above the vertically centered dashed line therein and its cathode n-type conductivity region below that dashed line. The intrinsic, or lightly doped region, is positioned about that dashed line.

In the cut away layer diagram of FIG. 5B, the ten SiC p-i-n diode dice 11 are shown in a stack with each soldered to its adjacent neighbor, or neighbors, using a gold and germanium eutectic alloy for this solder of 88% gold and 12% germanium. In addition, the anode p-type conductivity region in that die 11 at the top of the stack is similarly soldered to the upper leg of a "two-legged" upper contact, 18, using solder 17, and the cathode n-type conductivity region in that die 11 at the bottom of the stack is soldered with solder 17 to a lower contact, 19. Antiparallel diode die 16 has its anode p-type conductivity region soldered with solder 17 to bottom contact 19 and its cathode n-type conductivity region soldered with solder 17 to the lower leg of "two-legged" upper contact 18. Upper contact 18 and upper contact 18 are typically formed of gold plated copper. Dice 11, die 16 and portions of contacts 18 and 19 are housed in a suitable conventional electronic device housing, 20, from which other portions of contacts 18 and 19 emerge to provide interconnections therefor in a circuit in which it is to be used. An equivalent circuit for the device of FIG. 5B is presented in FIG. 5C without any indication of a housing therefor.

Figure 6A:
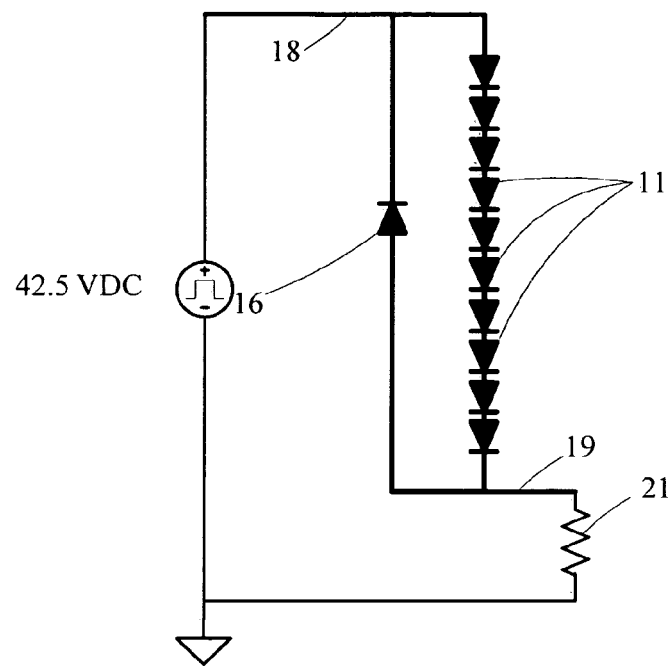
FIGS. 6A and 6B shows a schematic diagram of a pulse transient test circuit and a graph with plots of an electrical response.

A test circuit for providing a 30 V magnitude positive voltage pulse from a pulse generator to the snubber arrangement of FIGS. 5B and 5C is shown in FIG. 6A. A series interconnection of this snubber arrangement with a load resistor, 21, of 3.0 Ω resistance is connected across the voltage pulse source which provides a voltage pulse with a magnitude of 42.5 V.

Figure 6B:
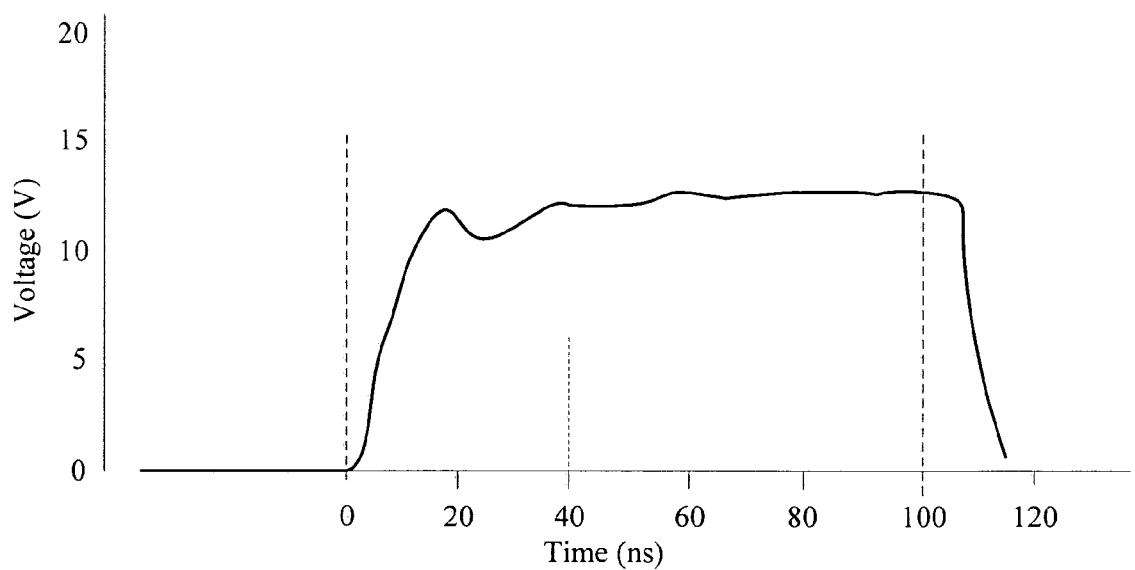

The results for applying such a voltage pulse having a duration of 100 ns to this snubber arrangement and load resistor are shown in plot presented in the graph of FIG. 6B presenting the resulting voltage across resistor 21. As can be seen there, the voltage is applied at the first course vertical dashed line and rises to 12.5 V or so across that resistor by the time of the fine vertical dashed line at about 40 ns to yield a rise time of that duration and thereby leaving about 30 V dropped across the snubber arrangement at that point. The applied 42.5 V pulse is terminated at 100 ns and the voltage across resistor 21 shortly thereafter decreases to zero as the current through it decreases to zero. Thus, the snubber arrangement is capable of reaching breakover and conducting substantial electrical current therethrough in the very short time of 40 ns to thereby be capable of providing its voltage limiting protection to any switch connected across it very rapidly to prevent arc discharges between the contacts of that switch during openings thereof.

Although the snubber arrangement example shown here is based on a 10 diode dice stack, which will clamp applied voltages in a switching circuit above 28 to 30 V to about no more than that thereacross, any number of diode dice can be provided in the soldered succession thereof to correspondingly provide the desired voltage clamping value. For example, a 5 diode dice stack would clamp applied voltages over 14 to 15 V in a switching circuit to limit them to about those values.

The inherent modularity of such snubber arrangements also allows the user to easily arrange such snubbers, each capable of only limiting voltages thereacross only to smaller than desired values, to be connected in series with one another across the switching circuit components being protected to limit voltages thereacross to greater values equal to the sum of the voltage limit values of each of the series connected snubber arrangements. Also, such snubber arrangements of similar voltage limiting capabilities each can in some circumstances be connected substantially in parallel with one another across the switching circuit components being protected for greater current and power handling capacity to accommodate larger current transients.

Although the present invention has been described with reference to preferred embodiments, workers skilled in the art will recognize that changes may be made in form and detail without departing from the spirit and scope of the invention.

The invention claimed is:

1. A voltage excursion control system for limiting voltage peaks in electrical circuits otherwise occurring across selected components therein in response to changing conditions in such circuits, the system comprising:

a plurality of silicon carbide diode dice each having an anode and a cathode region therein and each positioned in a spatial succession thereof with each such die being interconnected by an electrically conductive metal bond with each neighbor thereof in the succession such that each cathode region of each die face toward a common end of the succession, and first and second electrically conductive electrodes each electrically interconnected by an electrically conductive metal bond with a corresponding one of the dice at opposite ends of the succession.

2. The system of claim 1 wherein the electrically conductive metal bond is formed of a gold-germanium alloy.

3. The system of claim 1 wherein that one of the first and second electrodes interconnected to an anode region of a die is so interconnected by one of a pair of extensions provided in that electrode with a gap therebetween in which the succession and the remaining electrode are positioned and further comprising an antiparallel diode die having a cathode region therein electrically interconnected by an electrically conductive metal bond with that remaining one of the pair of extensions and having an anode region therein electrically interconnected by an electrically conductive metal bond with the remaining one of the first and second electrodes.

4. The system of claim 3 wherein the antiparallel diode die is a silicon carbide diode die.

5. The system of claim 3 wherein the electrically conductive metal bond is formed of a gold-germanium alloy.

6. The system of claim 1 wherein the first and second electrodes are electrically connected across the selected components of an electrical circuit, and the selected components comprise a circuit switch.

7. The system of claim 6 wherein that one of the first and second electrodes interconnected to an anode region of a die is so interconnected by one of a pair of extensions in provided in that electrode with a gap therebetween in which the succession and the remaining electrode are positioned and further comprising an antiparallel diode die having a cathode region therein electrically interconnected by an electrically conductive metal bond with that remaining one of the pair of extensions and having an anode region therein electrically interconnected by an electrically conductive metal bond with the remaining one of the first and second electrodes.

8. The system of claim 7 wherein the antiparallel diode die is a silicon carbide diode die.

* * * * *